(12) United States Patent
Ohkubo et al.

(10) Patent No.: US 6,711,194 B2
(45) Date of Patent: Mar. 23, 2004

(54) HIGH OUTPUT POWER SEMICONDUCTOR LASER DIODE

(75) Inventors: Michio Ohkubo, Tokyo (JP); Hitoshi Shimizu, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/072,816

(22) Filed: Feb. 8, 2002

(65) Prior Publication Data

US 2003/0026306 A1 Feb. 6, 2003

(30) Foreign Application Priority Data

Feb. 8, 2001 (JP) .......................... 2001-032099
Oct. 18, 2001 (JP) .......................... 2001-320451

(51) Int. Cl.$^7$ .............................................. H01S 5/00
(52) U.S. Cl. ................................. 372/45; 372/46
(58) Field of Search ......................... 372/38.01, 38.02, 372/43, 45, 46

(56) References Cited

U.S. PATENT DOCUMENTS

| | | | | |
|---|---|---|---|---|
| 5,912,913 A | * | 6/1999 | Kondow et al. | 372/45 |
| 6,049,556 A | * | 4/2000 | Sato | 372/46 |
| 6,087,681 A | * | 7/2000 | Shakuda | 257/103 |
| 6,127,692 A | * | 10/2000 | Sugawa et al. | 257/30 |
| 6,169,296 B1 | * | 1/2001 | Kamiyama et al. | 257/94 |
| 6,232,623 B1 | * | 5/2001 | Morita | 257/103 |
| 6,376,866 B1 | * | 4/2002 | Shakuda | 257/103 |
| 6,449,299 B1 | * | 9/2002 | Sato | 372/45 |
| 6,455,340 B1 | * | 9/2002 | Chua et al. | 438/31 |
| 6,512,629 B1 | * | 1/2003 | Dijaili et al. | 359/344 |

OTHER PUBLICATIONS

Chu, S. N. G., et al., "Generic degradation mechanism for 980 nm $In_xGa_{1-x}As/GaAs$ strained quantum–well lasers" American Institute of Physics, Applied Physics Letters, vol. 78, No. 21, May, 2001, pp. 3166–3168.

R.A. Morgan, et al., 1 W (Pulsed) Vertical Cavity Surface Emitting Laser, Electronics Letters, Jan. 21, 1993, vol. 29 No. 2, pp. 206–207.

Kenichi IGA, Vertical–Cavity Surface–Emitting Laser— Progress and Prospects –, IEICE Trans. Electron, Jan. 2002, vol. E85–C, No. 1, pp. 10–19.

* cited by examiner

*Primary Examiner*—Paul Ip
*Assistant Examiner*—Tuan N. Nguyen
(74) *Attorney, Agent, or Firm*—Oblon, Spivak, McClelland, Maier & Neustadt, P.C.

(57) ABSTRACT

A semiconductor laser diode has a GaAs substrate and a resonant cavity formed on the GaAs substrate. The resonant cavity includes a QW structure having a GaInAsN well layer and a AlGaAs or GaInAsP barrier layers. Specific combination of the indium content and the nitrogen content in the well layer alone or in combination with the specific composition of the barrier layers provides a long-term operation at a higher output power.

40 Claims, 10 Drawing Sheets

TYPE-I
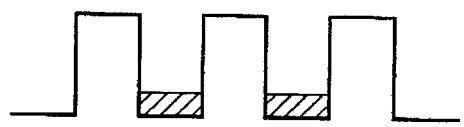
FIG. 6A
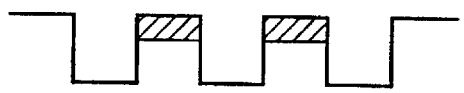
TYPE-II
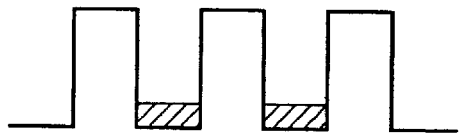
FIG. 6B
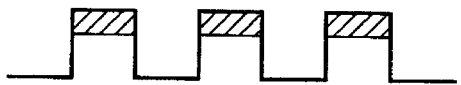

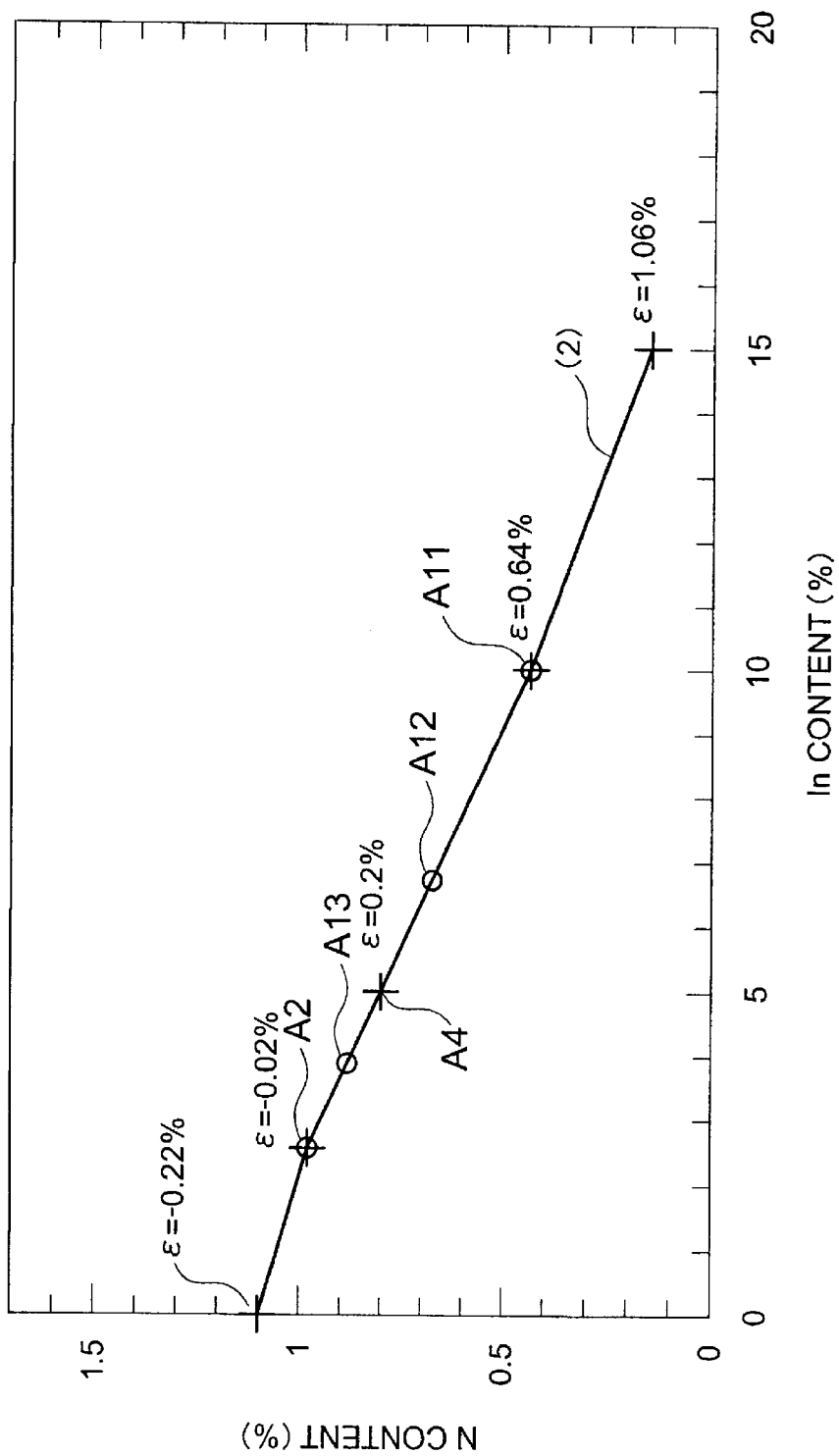

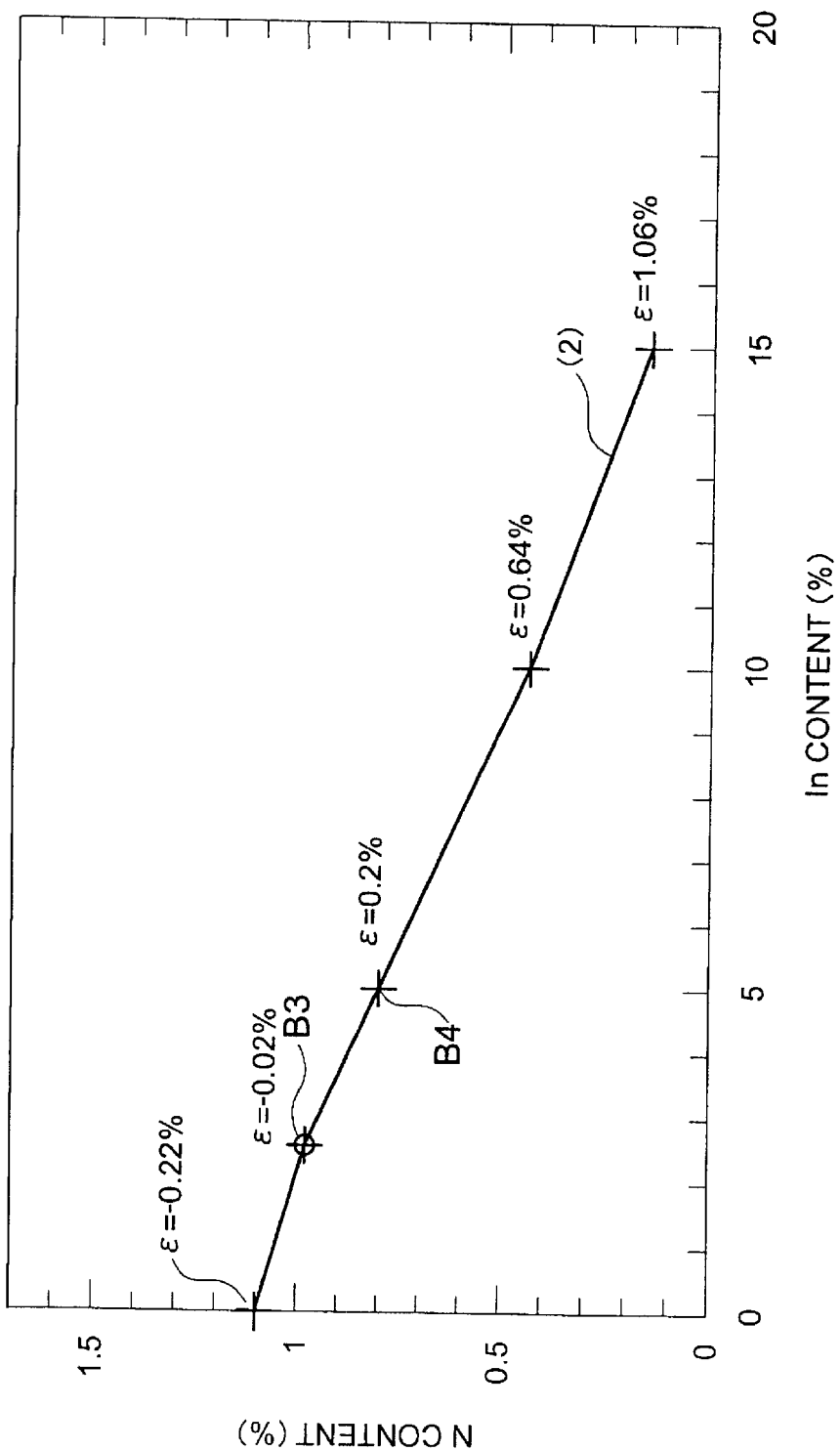

HIGH OUTPUT POWER SEMICONDUCTOR LASER DIODE

RELATED APPLICATIONS

The present application claims the benefit of foreign priority under 35 U.S.C. section 119 to Japanese Applications 2001-032099 filed Feb. 8, 2001, and 2001-320451 filed Oct. 18, 2001, both of which are incorporated herein by reference.

BACKGROUND OF THE INVENTION (a) Field of the Invention

The present invention relates to a high output power semiconductor laser diode and, more particularly, to a semiconductor laser diode formed on a GaAs substrate and having an active layer including at least indium (In), gallium (Ga) and arsenic (As).

(b) Description of the Related Art

Today, semiconductor laser diodes are increasingly used in a variety of fields, and the request for higher output power semiconductor laser diodes is also increasing.

For example, in an optical communication field, the output power of a pumping light source used for pumping an erbium-doped fiber amplifier (EDFA) was as low as several tens of milli-watts in the beginning of the 1990's when it was developed for practical use. However, along with the recent remarkable development of the optical communication technology, such as wavelength division multiplexing (WDM), the output power requested for the current semiconductor laser diode is far higher than 100 milli-watts, in addition to the operational lifetime being requested at one million hours for the semiconductor laser diode.

FIG. 1 shows a conventional semiconductor laser diode (sometimes referred to as simply "laser diode" hereinafter) which is generally used as a pumping light source for an EDFA. The laser diode, generally designated by numeral 60, includes an n-type GaAs (n-GaAs) substrate 12 and a resonant cavity formed thereon as a layer structure. The layer structure includes an n-AlGaAs cladding layer 14, an InGaAs/GaAs multiple-quantum-well (MQW) active layer structure 62, a p-AlGaAs cladding layer 22, and a p-GaAs cap layer 24 consecutively formed on the n-GaAs substrate 12. The resonant cavity has an emission wavelength of 980 nm.

To adjust the emission wavelength at 980 nm, each InGaAs quantum well layer of the MQW active layer structure 16 has an indium (In) atomic ratio of 0.16 to 0.20 with respect to the total amount of III-group atoms, and has a compressive strain in the range between 1.1% and 1.4%. Here, and throughout this document, we use the conventional definition of the strain ($\epsilon$) of the well layer with respect to the substrate. The strain may be computed from the average lattice constants of the well material and the substrate material as follows:

$$\text{strain } \epsilon \text{ (in percentage)} = 100\% \cdot (Aw - Asub)/Asub,$$

where Aw is the average lattice constant of the material of the well layer, and where Asub is the average lattice constant of the material of the substrate. A negative value indicates tensile strain, while a positive value indicates compressive strain. Because the layers that are disposed between the substrate and the well layer are relatively thin, these intermediate layers conform to the average lattice constant of the substrate, and effectively present the average lattice constant of substrate to the well layer.

As another point of terminology, the atomic ratio is also known as the "mole fraction." The atomic ratio of an element in a III-V composition is the amount of that element divided by the total amount of the elements in the composition which are from the same group (e.g., column) of the periodic table. In addition, the amount of an element in a III-V material composition may also be specified as a content percentage.

The content percentage is 100 times the corresponding atomic ratio. For example, an atomic ratio of 0.16 for indium is equivalent to an indium content of 16%.

Among the layer structure, the cap layer 24 and the top portion of the cladding layer 22 are configured to form a mesa structure having a ridge-stripe waveguide. On the side surfaces of the mesa structure and the top of the cladding layer 22, a SiN film 28 is formed except for an opening 26 which exposes therefrom the top surface of the cap layer 24. A p-side electrode 30 made of metallic films including Ti/Pt/Au films is formed on the SiN film 28 and in contact with the cap layer 24 through the opening 26. An n-side electrode 32 made of metallic films including AuGeNi/Au films is formed on the bottom surface of the GaAs substrate 12.

The strong demand for the WDM system requests year by year a higher output power of the pumping light source used for the EDFA. The conventional semiconductor laser diode has an operational lifetime as long as one million hours in the output power region lower than 100 milli-watts. However, the conventional laser diode suffers from a far shorter lifetime in the output power region higher than 100 milli-watts, thereby exhibiting a lower reliability with respect to the long-term operation.

SUMMARY OF THE INVENTION

In view of the above, it is an object of the present invention to provide a 980-nm-band semiconductor laser diode which is capable of operating with a higher reliability in a longer lifetime at a higher output power region.

The present invention provides, in a first broad aspect thereof, a semiconductor laser device including: a GaAs substrate having a top surface; and a resonant cavity having a layer structure formed on the GaAs substrate and oriented to guide light in a direction parallel to the top surface of the GaAs substrate, the layer structure having an active layer which generates light when an electric current is passed through it. The active layer has a light-generation layer which comprises a first amount of group-III atoms and a second amount of group-V atoms, the first amount of group-III atoms including at least gallium (Ga) and the second amount of group-V atoms including at least arsenic (As). The light-generation layer further includes at least one of the elements of indium and nitrogen, the indium being limited to an atomic ratio in the range of 0.0 to 0.10 with respect to the amount of group-III atoms, and the nitrogen being limited to an atomic ratio in the range of 0.0 to 0.025 with respect to the amount of group-V atoms. As used herein, a light-generation layer is a layer in which electromagnetic radiation is generated. A light-generation layer may comprise a well layer disposed between two barrier layers (e.g., a quantum well structure), or may comprise a layer disposed between two optical guiding layers. In each of these examples, the conduction-band energy level of the light-generation layer is typically lower than the conduction-band energy level of the barrier layers or the optical guiding layers.

In one embodiment of the present invention constructed for lasing operation near 980 nm (that is, having a photoluminescence peak near 980 nm for the light-generation layer), the layer structure further comprises an $Al_zGa_{1-z}As$ barrier layer, and the light-generation layer comprises a $Ga_xIn_{1-x}As_yN_{1-y}$ well layer disposed adjacent to the $Al_zGa_{1-z}As$ barrier layer, with x, y and z satisfying the relationships: $0 \leq 1-x \leq 0.05$, $0 < 1-y \leq 0.011$ and $0.03 \leq z \leq 1$, respectively. The layer structure further comprises one or more cladding layers to optically confine the light generated by the light-generation layer. To enable lasing operations between 980 nm and 1100 nm (to provide a photoluminescence peak for the light-generation layer in the range of 980 nm to 1100 nm), the upper limit of the nitrogen atomic ratio (1-y) may be raised to 0.025 (2.5% content), and the minimum aluminum atomic ratio in the barrier layer should be increased in proportion from 0.03 (3% content) at 980 nm laser emission to 0.13 (13% content) at 1100 nm laser emission. For lasing operations between 980 nm and approximately 940 nm, the minimum aluminum atomic ratio in the barrier layer can be decreased from 0.03 (3% content) at 980 nm laser emission to 0 (0% content) at approximately 940 nm laser emission.

In another embodiment of the present invention constructed for lasing operation near 980 nm (that is, having a photoluminescence peak near 980 nm for the light-generation layer), the layer structure further comprises a $Ga_{x2}In_{1-x2}As_{y2}P_{1-y2}$ barrier layer, and the light-generation layer comprises a $Ga_{x1}In_{1-x1}As_{y1}N_{1-y1}$ well layer which is disposed adjacent to the $Ga_{x2}In_{1-x2}As_{2y}$ barrier layer, with x1, x2, y1 and y2 satisfying the relationships $0 \leq 1-x1 \leq 0.05$, $0 < x2 < 1$, $0 < 1-y1 < 0.011$ and $0 < y2 < 1$, respectively. The $Ga_{x2}In_{1-x2}As_{y2}P_{1-y2}$ barrier layer is preferably substantial lattice-matched to the GaAs substrate (magnitude of strain less than 0.2%), and preferably has a bandgap wavelength of 0.85 µm or less. The layer structure further comprises one or more cladding layers to optically confine the light generated by the light-generation layer. To enable lasing operations between 980 nm and 1100 nm (to provide a photoluminescence peak for the light-generation layer in the range of 980 nm to 1100 nm), the upper limit of the nitrogen atomic ratio (1-y) may be raised to 0.025 (2.5% content), and upper limit of the bandgap wavelength of the barrier layer should be decreased in proportion from 0.85 µm at 980 nm laser emission to 0.805 µm at 1100 nm laser emission. For lasing operations between 980 nm and approximately 940 nm, the upper limit of the bandgap wavelength of the barrier layer can be increased from 0.85 µm at 980 nm laser emission to 0.87 µm at approximately 940 nm laser emission.

In yet another embodiment of the present invention constructed for lasing operation near 980 nm (that is, having a photoluminescence peak near 980 nm for the light-generation layer), the layer structure further comprises an $Al_zGa_{1-z}As$ barrier layer, and the light-generation layer comprises a $Ga_xIn_{1-x}As_{1-y1-y2}N_{y1}Sb_{y2}$ well layer which is disposed adjacent to the $Al_zGa_{1-z}As$ barrier layer, with x, y1, y2 and z satisfying the relationships $0 \leq 1-x \leq 0.05$, $0 \leq y1 \leq 0.011$, $0 < y2 < 0.04$ and $0.03 \leq z \leq 1$, respectively. The layer structure further comprises one or more cladding layers to optically confine the light generated by the light-generation layer. In this embodiment, it is noted that the known upper limit of the Sb content for the improvement of the crystallinity during growth of the GaInNAs layer is 1.6% if the nitrogen content therein is 0.44%, as described in an earlier application No. JP-2001-124300. Since the upper limit of the nitrogen atomic ratio y1 in the above formula $Ga_xIn_{1-x}As_{1-y1-y2}N_{y1}Sb_{y2}$ of the well layer is 0.011 ($0 \leq 1-x \leq 0.05$, $0 < y1 \leq 0.011$), corresponding to a content percentage of 1.1%, the upper limit of the Sb content (corresponding to atomic ratio Y2) necessary for improvement in this well layer is calculated as 4% as follows:

$$\frac{1.6\% \times 1.1\%}{0.44\%} = 4\%$$

Thus, the relationship $0 < y2 < 0.04$ in the $Ga_xIn_{1-x}As_{1-y1-y2}N_{y1}Sb_{y2}$ well layer is obtained. To enable lasing operations between 980 nm and 1100 nm (to provide a photoluminescence peak for the light-generation layer in the range of 980 nm to 1100 nm), the upper limit of the nitrogen atomic ratio (y1) may be raised to 0.025 (2.5% content), and the minimum aluminum atomic ratio in the barrier layer should be increased in proportion from 0.03 (3% content) at 980 nm laser emission to 0.13 (13% content) at 1100 nm laser emission. The upper limit of Sb atomic ratio y2 would accordingly increase from 0.04 (4% content) at a nitrogen atomic ratio of 0.011 (1.1% content) to 0.091 (9.1% content) for a nitrogen atomic ratio of 0.025 (2.5% content). For lasing operations between 980 nm and approximately 940 nm, the minimum aluminum atomic ratio in the barrier layer can be decreased from 0.03 (3% content) at 980 nm laser emission to 0 (0%) at approximately 940 nm laser emission.

In still another embodiment of the present invention constructed for lasing operation near 980 nm (that is, having a photoluminescence peak near 980 nm for the light-generation layer), the layer structure further comprises a $Ga_{x2}In_{1-x2}AS_{y2}P_{1-y2}$ barrier layer, and the light-generation layer comprises a $Ga_{x1}In_{1-x1}As_{1-y1-y2}N_{y1}Sb_{y2}$ well layer which is disposed adjacent to the $Ga_{x2}In_{1-x2}As_{y3}P_{1-y3}$ barrier layer, with x1, x 2, y1, y2 and y3 satisfying the relationships $0 \leq 1-x1 \leq 0.05$, $0 < x2 < 1$, $0 < y1 \leq 0.011$, $0 < y2 < 0.04$ and $0 < y3 < 1$, respectively. The $Ga_{x2}In_{1-x2}AS_{y3}P_{1-y3}$ barrier layer is preferably substantially lattice-matched to the GaAs substrate (magnitude of strain less than 0.2%), and preferably has a bandgap wavelength of 0.85 µm or less. The layer structure further comprises one or more cladding layers to optically confine the light generated by the light-generation layer. To enable lasing operations between 980 nm and 1100 nm (or a photoluminescence peak for the light-generation layer in this range of wavelengths), the upper limit of the nitrogen atomic ratio (1-y) may be raised to 0.025 (2.5% content), and upper limit of the bandgap wavelength of the barrier layer should be decreased in proportion from 0.85 µm at 980 nm laser emission to 0.805 µm at 1100 nm laser emission. The upper limit of Sb atomic ratio y2 would accordingly increase from 0.04 (4% content) at a nitrogen atomic ratio of 0.01 1 (1.1% content) to 0.091 (9.1% content) for a nitrogen atomic ratio of 0.025 (2.5% content). For lasing operations between 980 nm and approximately 940 nm, upper limit of the bandgap wavelength of the barrier layer can be increased from 0.85 µm at 980 nm laser emission to 0.87 µm at approximately 940 nm laser emission.

In preferred implementations of each of the above embodiments, the atomic ratio of gallium (Ga) with respect to the amount of group-III atoms in the light-generation layer is equal to or greater than 0.5, and the atomic ratio of arsenic (As) with respect to the amount of group-V atoms in the light-generation layer is equal to or greater than 0.5. Also, the preferred implementations are conventional pumping laser light sources which output at least 100 mW of optical power through a surface portion of the laser's front facet, with the surface portion having an area which is less than 100 square micron.

In accordance with the semiconductor laser device of the present invention, the laser diode operates with a higher reliability in a long-term operation at a higher output power, owing to the specific compositions of the light-generation layers which allow for a reduction in the strain of the active layer with respect to the GaAs substrate.

The above and other objects, features and advantages of the present invention will be more apparent from the following description, referring to the accompanying drawings.

BRIEF DESCRIPTION OF THE DRAWINGS

FIGS. 6A and 6B are bandgap diagrams of MQW structures of type I and type II.

FIG. 9 is a graph extracted from FIG. 4A according to the present invention.

FIG. 10 is a graph extracted from FIG. 5A according to the present invention.

PREFERRED EMBODIMENTS OF THE INVENTION

Figure 1:
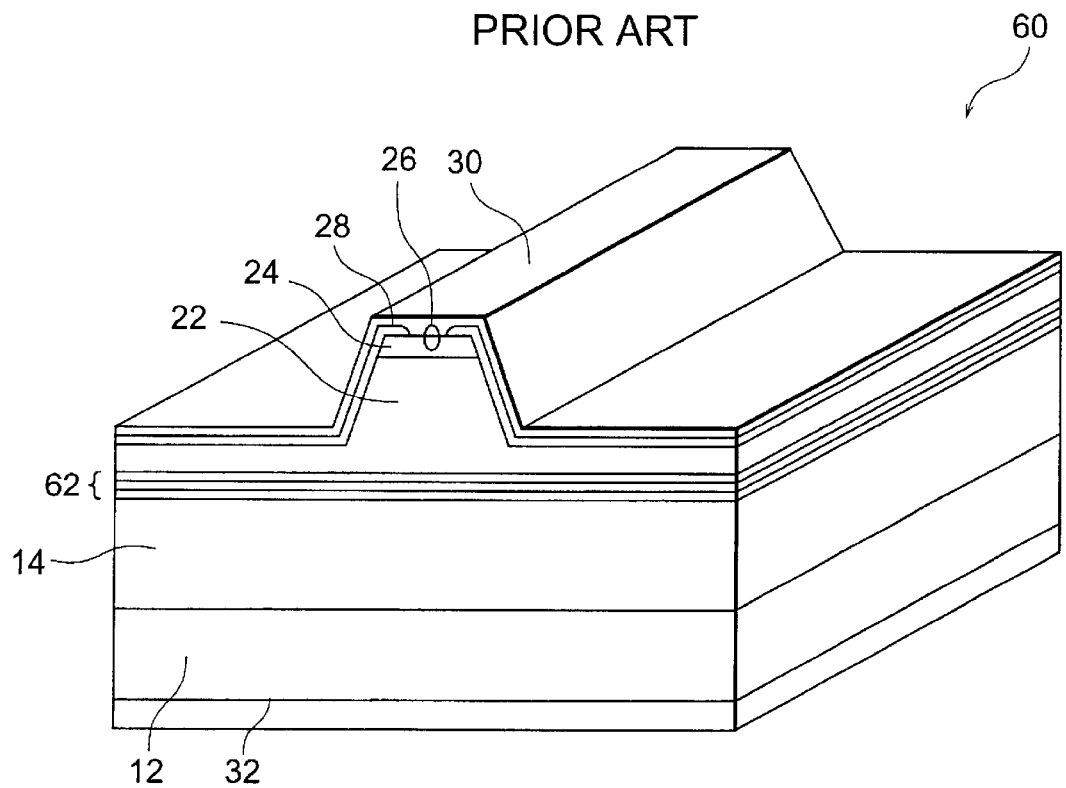
FIG. 1 is a perspective view of a conventional laser device.

Before describing the preferred embodiments of the present invention, the principle of the present invention will be described hereinafter for a better understanding of the present invention.

The most noticeable factor among the factors degrading or limiting the optical output power of the laser diode is a so-called catastrophic optical damage (COD) occurring at the emission end of the laser diode.

The emission-end COD results from a positive feedback loop including an optical absorption at the emission end of the resonant cavity, a temperature rise at the emission end due to the optical absorption, a bandgap reduction due to the temperature rise, and an increase of the optical absorption due to the bandgap reduction and causing a further temperature rise at the emission end. In the prior art, a variety of structures for the laser diode such as an "opening structure" are proposed for suppressing the emission-end COD problem, and it is considered that the emission-end COD problem resulting from the meltdown of the emission end of the resonant cavity has been solved.

The present inventors have found, in addition to the known emission-end COD of the laser diode, a phenomenon similar to the emission-end COD and occurring at the higher output power range of the laser diode. The damage mode occurring in the laser diode similarly to the principle of the emission-end COD, as described above, is called herein an internal COD. The internal COD hinders the laser diode from operating at a higher output power.

The internal COD is such that a conventional laser diode formed on a GaAs substrate and including an InGaAs active layer having a tertiary-mixed-crystal structure involves a degradation mode or damage mode, which closely resembles to the behavior of the laser diode involved with the emission-end COD, although the laser diode is not involved in the meltdown of the emission end. This degradation or damage occurs after operating continuously for a long time of 1000 hours or more at a high output power of 100 milli-watts or more.

In other words, the "internal COD" means a degradation phenomenon which resembles to the emission-end COD and which a laser diode formed on a GaAs substrate involves in the laser characteristic thereof after operation continuously for a long period of time at a high output power, as high as 100 milli-watts, for example.

The present inventors observed the laser diode involved with the internal COD by using a transmission electron microscope, and analyzed the internal COD to find the sign of minor meltdown in the active layer and a phase separation in the vicinity of the sign of the minor meltdown.

In the phase separation, it is considered that the tertiary-mixed-crystal structure of InGaAs constituting the active layer was locally melted and thus separated into an InAs section and an InGaAs section, and further into the InAs section and a GaAs section. So long as the InGaAs active layer is used, the phase separation is, in principle, difficult to avoid. However, the phase separation is a large obstacle in the way to a higher reliability and a higher output power of the laser diode.

Thus, it is important to achieve a laser diode which is capable of operating for a long time at a high output power without involving the internal COD.

It is noticed that the phase separation of the tertiary-mixed-crystal such as InGaAs occurs basically because the compound semiconductor material is subjected to the melting point thereof. The melting point is generally lowered due to a strain in the material, and accordingly, there is a possibility that some strain resides in the active layer to induce the phase separation in the active layer. In view of the above, it is important to achieve a QW active layer structure which is less susceptible to the phase separation in order to prevent the internal COD in the laser diode.

The present inventors conducted the experiments as detailed below to conceive the principle of the present invention.

The GaInAs layer in the EDFA involves a local temperature rise during operation at a high output power, wherein a minute, semi-spherical area of the GaInAs (such as a semi-sphere having a diameter on the order of one micron) is heated up to a temperature of about 900 degrees C., i.e., in the vicinity of the melting point of the GaInAs layer. This causes a substantially melted state of the minute area of the GaInAs layer, whereby the GaInAs material in this minute area is separated into an InAs section and a GaAs section, both such sections being located in the minute area.

In particular, if the atomic ratio of indium (In), one of the III-group atoms in the GaInAs layer, exceeds 0.1 with respect to the total amount of III-group atoms, the inventors have discovered that the melting point of the GaInAs layer is lowered to be susceptible to the phase separation after about 1,000 hours of high-output operation, whereby InAs crystals are precipitated. The InAs crystals precipitated on the GaInAs layer have a strain with respect to the GaAs layer to generate crystal defects. The crystal defects generally grow to cause an internal destruction. The inventors believe that they are the first to recognize the susceptibility of the GaInAs layer to phase separation after about 1,000 hours of operation at high optical output. In view of their discovery, the inventors believe that it is thus important to maintain the atomic ratio of indium (In) at or below 0.1 (content of 10%) in the GaInAs layer for suppression of the phase separation. However, the use of such low indium content prevents one from realizing an emission wavelength near the important value of 980 nm used for pumping operations. Thus, on the basis of prior art teachings, it appears that one cannot simultaneously minimize the susceptibility to phase separation and maintain an emission wavelength near 980 nm.

The inventors have further discovered that these two objectives can be achieved by introducing a small amount of nitrogen (N) into the GaInAs layer as a group-V element. The inventors believe that the group-III indium atom has a larger lattice constant than the group-III gallium atom, and that this larger lattice constant creates strain within the GaInAs material. The inventors further believe that the nitrogen atom has a smaller lattice constant than the arsenic atom (both being group-V elements), and that the replacement of a small amount of the arsenic atoms with nitrogen atoms can effectively compensate for the strain caused by the group-III indium atom. The inventors have further discovered that the introduction of nitrogen atoms enables one to maintain a laser emission wavelength near 980 nm when the atomic ratio of indium is reduced from the range of 0.16–0.20 (16%–20% content) to a value of 0.10 (10% content) and below. The experiments conducted by the present inventors revealed that a preferable nitrogen content in the GaInAsN layer is 0.012 or less with respect to the total amount of V-group atoms to achieve laser emission near the 980 nm value. The inventors' experiments further indicate that laser emission near 980 nm can be maintained by introducing nitrogen at an approximate rate of one atom for every 14 to 16 indium atoms removed. For a broader range of laser emission from 920 nm to 1100 nm, the inventors have found that the atomic ratio of nitrogen ranges from 0 to 0.025 when the atomic ratio of indium ranges from 0 to 0.10, and from 0.001 to 0.025 when the atomic ratio of indium ranges from 0 to 0.05, and from 0.0045 to 0.025 when the indium content is near or at zero. For a more preferred range of laser emission from 920 nm to 1010 nm, the inventors have found that the atomic ratio of nitrogen ranges from 0 to 0.0155 when the atomic ratio of indium ranges from 0 to 0.10, and from 0.001 to 0.0155 when the atomic ratio of indium ranges from 0 to 0.05, and from 0.0045 to 0.0155 when the indium content is near or at zero.

The conventional 980-nm-band laser diode includes a $Ga_xIn_{1-x}As$ well layer having a compressive strain between 1.1% and 1.4%, wherein $0.16 \leq 1-x \leq 0.20$, in the QW active layer structure. In the conventional laser diode including InGaAs/GaAs-based materials, the strain is adjusted between 1.1% and 1.4% for achieving an emission wavelength of 980 nm. This prevents the higher reliability for long-term operation, such as one million hours or more, at a higher output power.

In contrast, the inventors have conducted intensive studies on a GaInNAs based laser diode, which can be formed on a GaAs substrate and can lase at an emission wavelength as long as 1.3 μm. According to the studies, although a GaInAs layer has a compressive strain, the compressive strain can be reduced by incorporating therein nitrogen as a mixed crystal. By selecting the amounts of Indium (In) content and nitrogen (N) content in the GaInNAs layer at specific ranges discovered by the inventors, the absolute value of the compressive strain ($|\epsilon|$) can be reduced down to 0.2% or below, to substantially lattice-match the GaInNAs layer to the GaAs substrate in the 980-nm-band GaInNAs laser diode.

However, if the materials and the composition of the barrier layer which includes generally (Al)GaAs or Ga(In)AsP are not suitably selected in the GaInNAs based laser diode, the QW structure assumes a type-II structure, whereby the emission efficiency is reduced and the resultant laser diode is not practical. The parentheses used in the formula means that the element between the parentheses may be either incorporated or omitted.

The term "type-II structure" as used above means a QW structure having a bandgap diagram such as shown in FIG. 6B wherein each electron and each positive hole are captured or confined in different semiconductor layers or different spatial positions. On the other hand, the type-I QW structure has a bandgap diagram such as shown in FIG. 6A, wherein both the electron and the positive hole are captured or confined in the same semiconductor layer having a lower bandgap energy, or the same spatial position.

Thus, the present inventors conceived that a 980-nm-band GaInNAs laser diode having lower threshold, higher optical efficiency and high reliability can be achieved by selecting the composition of the GaInNAs well layer and the composition of the AlGaAs or GaInAsP barrier layer in specified ranges discovered by the inventors, which the inventors found through conducting a variety of experiments and simulations based on the above discoveries and concepts.

First, in order for developing a 980-nm-band laser diode having an operational lifetime of $10^6$ hours or more at an output power of 300 milli-watts or above, the composition of the GaInNAs well layer was selected to allow the strain of the GaInNAs well layer to be limited to within a range of ±0.65%, and most preferably within a range of ±0.2%.

(1) In the Case of (Al)GaAs Barrier Layers

Figure 4A:
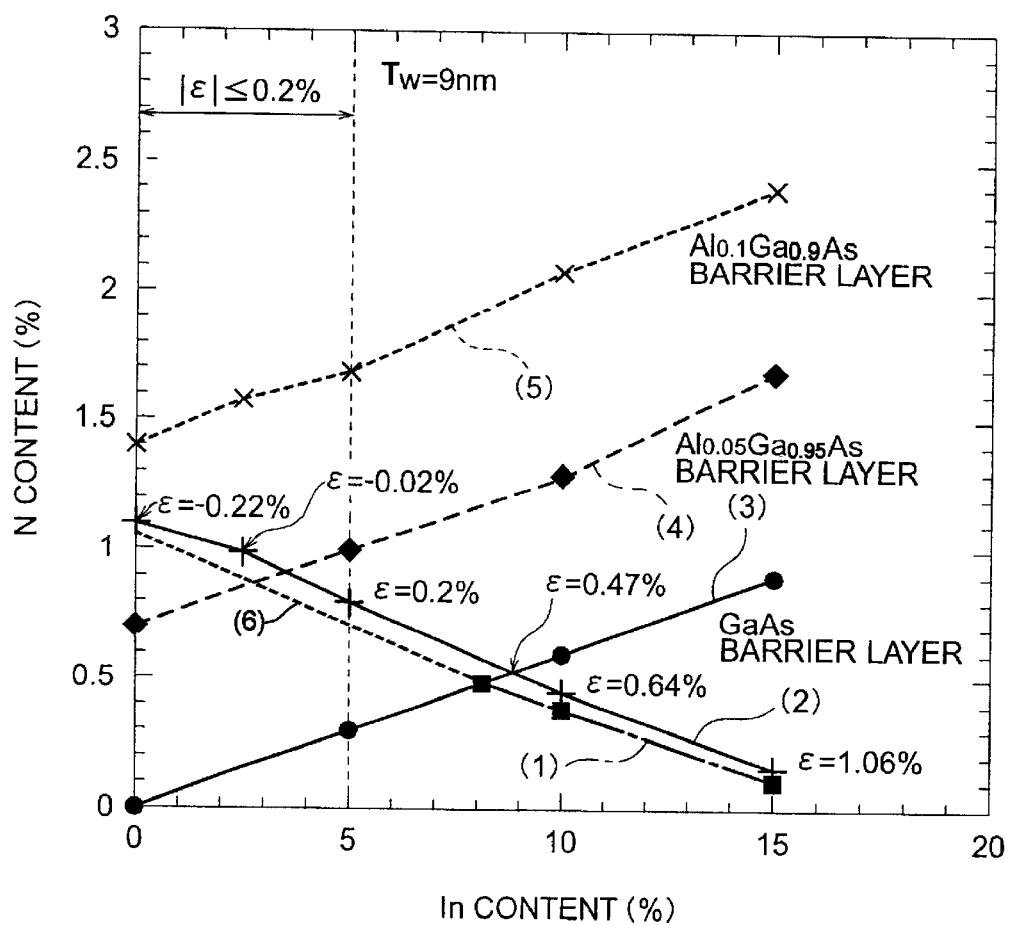
FIG. 4A is a compositional diagram of an active layer, with the composition of a barrier layer being a parameter, in the GaInNAs/AlGaAs MQW active layer structure in the embodiment shown in FIG. 1 according to the present invention.

The combination of indium (In) content and nitrogen (N) content in the GaInNAs well layer was determined to achieve an emission wavelength (Lw) of 980 nm, with the barrier layers comprising (Al)GaAs material, the result of which is shown in FIG. 4A. Each of lines (1) and (2) shows a combination of both the indium and nitrogen contents in the well layer(s) which provides an emission wavelength of 980 nm in the case wherein the thickness of each well layer is set at 9 nm, with the composition of the (Al)GaAs barrier layers being a parameter.

Line (1) passing through square (■) dots shows the case of GaAs barrier layers, whereas line (2) passing through plus-shaped (+) dots shows the case of $Al_{0.1}Ga_{0.9}As$ barrier layers. Each dot is accompanied by an indication of the strain (ε) in the well layer(s) having the composition specified by the dot. Similar lines for barrier layers with higher aluminum contents appear above line (2), and are relatively close to line (2).

For the case of lines (1) and (2), in order for lattice-matching the well layer to the GaAs substrate by limiting the strain as $|E| \leq 0.2\%$, the indium (In) content should be 5% or less on line (2). Limiting the indium content to 10% limits the strain as $|\epsilon| \leq 0.65\%$.

FIG. 4A also shows three lines (3), (4), and (5), which are drawn for the three cases where the barrier layers of the quantum-well structure comprises GaAs material, $Al_{0.05}Ga_{0.95}As$ material, and $Al_{0.1}Ga_{0.9}As$ material, respectively. Line (3) shows the dividing line between type-I (FIG. 6A) and type-II (FIG. 6B) band structures of the quantum well in the case where the barrier layers comprise GaAs material and where the well layer(s) comprise various combinations of indium and nitrogen contents. The combinations of indium and nitrogen contents which are located above line (3) produce type-II quantum-well structures, which are not desirable. The combinations which are located at or below line (3) produce type-I quantum well structures, which are desirable. Each of lines (4) and (5) is similar to line (3) in meaning except that line (4) is drawn for barrier layers which comprise $Al_{0.05}Ga_{0.95}As$ material and line (5) is drawn for barrier layers which comprise $Al_{0.1}Ga_{0.9}As$ material. Combinations of indium and nitrogen which are located above lines (4) and (5) produce type-II quantum-well structures for the respective barrier-layer compositions represented by these lines; and compositions at or below the lines (4) and (5) produce type-I quantum-well structures. Additional lines similar to lines (3)–(5) may be drawn for other barrier-layer compositions; these additional lines will be substantially parallel to lines (3)–(5). As a point of reference, the GaAs barrier layer, the $Al_{0.05}Ga_{0.95}As$ barrier layer, and the $Al_{0.1}Ga_{0.9}As$ barrier layer have bandgap wavelengths of 0.87 μm, 0.83 μm and 0.80 μm, respectively, at 300°K.

In FIG. 4A, it can be seen from the intersections of lines (1), (2) and (3) that the strain can be reduced to a limited level of $\epsilon=0.47\%$ in the type-I structure for the case of a GaAs barrier layer. Further reduction in the magnitude of the strain can be achieved by increasing the aluminum content in the barrier layer in order to maintain the type-I quantum well structure. Line (6) shows the combinations of indium and nitrogen contents (as percentages of their respective atomic groups) in the well layer which maintain 980 nm laser emission while using the lowest possible amount of aluminum content in the barrier layer to maintain type-I band structure. For laser emission at 980 nm, the combinations of indium and nitrogen in the well layer is preferably set at or slightly above line (6), and usually at or below line (2). Line (6) can be mathematically defined as $$N=-0.07 \cdot X+0.0105 \quad [1]$$

for atomic ratios of indium between 0 and 0.08, where the parameter N represents the atomic ratio of nitrogen and the parameter X represents the atomic ratio of indium. Equation [1] may be written in terms of percent content as follows:

$$(\%N)=-0.07 \cdot (\%X)+1.05\% . \quad [2]$$

Line (2) can be approximated by the following mathematical definition:

$$N=-0.07 \cdot X+0.0115 \quad [3]$$

for atomic ratios of indium between 0 and 0.10, where the parameter N represents the atomic ratio of nitrogen and the parameter X represents the atomic ratio of indium. Equation [3] may be written in terms of percent content as follows:

$$(\%N)=-0.07 \cdot (\%X)+1.15\%. \quad [4]$$

For laser emission at 980 nm at room temperature, the combinations of indium and nitrogen in the well layer are preferably set at or above the line defined by equations [1] and [2], and at or below the line defined by equations [3] and [4].

To maintain a type-I quantum well structure with a strain of $|\epsilon| \leq 0.2\%$, the inventors have determined that the aluminum content in the barrier layer should be 3% or more, and can be up to 100%. The inventors' determination is based from extrapolating line (1) further to the left and by examining how the extrapolated line (1) and the line (2) intersect with the vertical line at 5% indium content (corresponding to $|\epsilon|=0.2\%$), and by visualizing the location of an additional line similar to line (3) which would be drawn for a barrier-layer composition of $Al_{0.03}Ga_{0.97}As$. This lower limit of 3% corresponds to a case where a 5% indium content is used in the well layer(s). As the indium content in the well layer(s) decreases towards 0%, the inventors have further found that the lower limit of aluminum content in the barrier layers rises from 3% towards approximately 7%, in a roughly inverse linear manner. In other words, the lower limit of aluminum in the barrier layers increases from 3% to 5% and then to 7% as the indium content in the well layer(s) decreases from 5% to 2.5% and then to 0%, respectively. The determination of the 7% figure was done in the same way as the 3% figure, but with the vertical line corresponding to 0% indium content being used. In all cases, the upper limit in aluminum content remains the same at 100%. As a specific example, a GaInNAs well layer having an In content of 5% requires an AlGaAs barrier layer having an Al content of 3% or above, whereas a GaNAs well layer(which is a GaInNAs layer having a zero indium content) requires an AlGaAs barrier layer having an Al content of 7% or above.

While constructing a laser for 980 nm emission is generally preferred, the laser can be constructed to intrinsically laser in the range of 965 nm to 995 nm (corresponding to the existence a peak in the photoluminescence spectrum of the quantum well in the range 965 nm to 995 nm at room temperature). Then, the actual lasing wavelength can be shifted to a desired value with the use of a light feedback component, such as a fiber Bragg grating (FBG). In some applications, the center of the FBG's reflectivity bandwidth is deliberately shifted from the design peak of the laser gain by as much as 15 nm (so-called "de-tuning"). In this case, the laser may be constructed to intrinsically laser in the range of 950 nm to 1010 nm (corresponding to the existence of a peak in the photoluminescence spectrum of the quantum well in the range 950 nm to 1010 nm at room temperature). In addition, the laser may be designed for higher operating temperatures than 300°K, which would require the intrinsic wavelength to be shortened, for example by as much as 30 nm. Accordingly, to account for such higher operating temperatures and the other factors, the quantum well may be designed to have a PL peak in the range 920 nm to 1010 nm in its photoluminescence spectrum at 300°K.

Figure 4B:
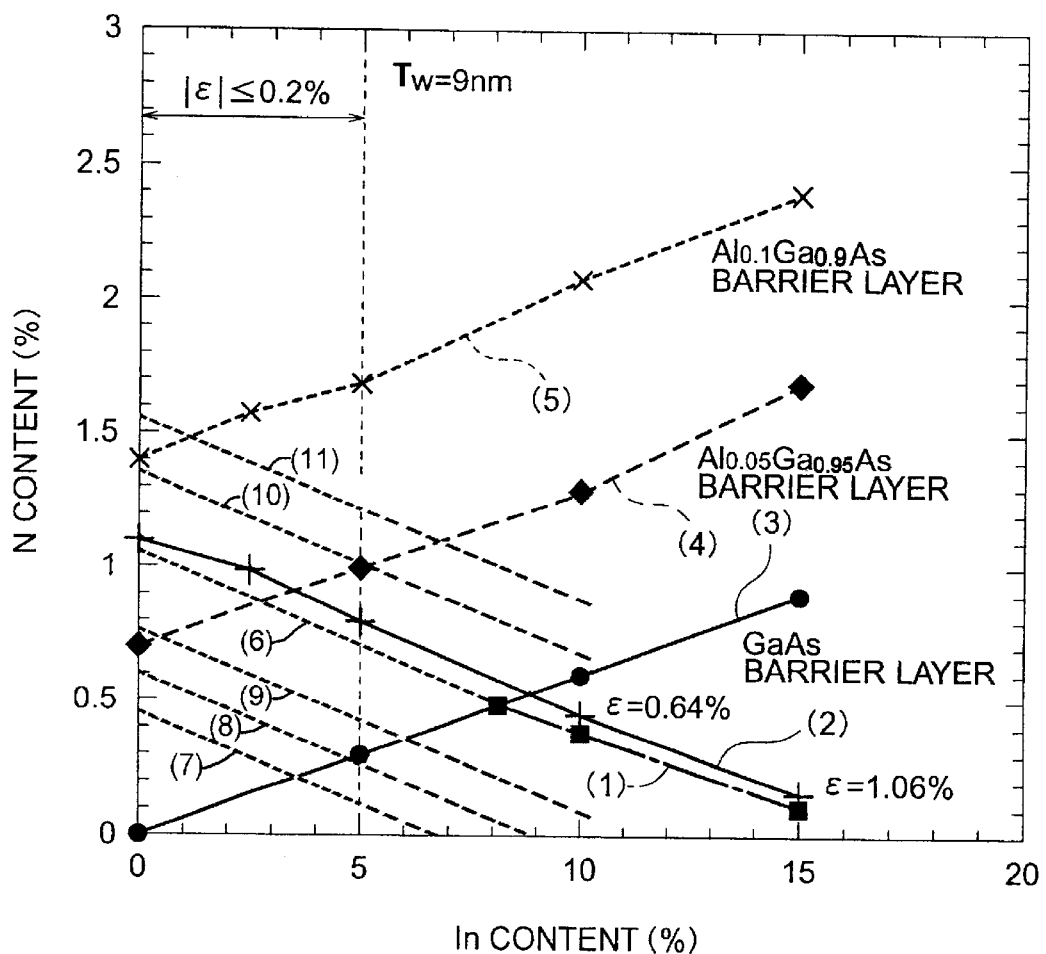
FIG. 4B is the compositional diagram of FIG. 4A with preferred ranges of indium and nitrogen contents indicated thereof according to the present invention.

FIG. 4B is a substantial copy of FIG. 4A, but with additional lines like line (6) which are constructed for different intrinsic emission wavelengths (as occurring at room temperature). Line (7) in FIG. 4B shows the combinations of indium and nitrogen contents in the well layer which provided for 920 nm intrinsic emission (920 nm PL peak) at 300°K while using the minimum amount of aluminum in the barrier layer. Line (7) can be mathematically defined as $$N=-0.07 \cdot X+0.0045 \quad [5]$$

for atomic ratios of indium between 0 and 0.064, where the parameter N represents the atomic ratio of nitrogen and the parameter X represents the atomic ratio of indium. Equation [5] may be written in terms of percent content as follows:

$(\%N)=-0.07 \cdot (\%X)+0.45\%$.  [6]

Line (11) shows the combinations of indium and nitrogen contents in the well layer which provided for 1010 nm intrinsic emission (1010 nm PL peak) at 300°K when using aluminum content of more than about 12% in the barrier layer. Line (11) can be mathematically defined as $N=-0.07 \cdot X+0.0155$  [7]

for atomic ratios of indium between 0 and 0.10. Equation [7] may be written in terms of percent content as follows:

$(\%N)=-0.07 \cdot (\%X)+1.55\%$.  [8]

In preferred embodiments, the atomic ratios of indium and nitrogen are selected to be at or below line (11), and at or above line (7).

Additional lines (8), (9), and (10) are shown in FIG. 4B. Line (8) shows the combinations of indium and nitrogen contents in the well layer which provided for 935 nm intrinsic emission (935 nm PL peak) at 300°K while using the minimum amount of aluminum in the barrier layer. Line (8) can be mathematically defined as $N=-0.07 \cdot X+0.006$  [9]

for atomic ratios of indium between 0 and 0.086, where the parameter N represents the atomic ratio of nitrogen and the parameter X represents the atomic ratio of indium. Equation [9] may be written in terms of percent content as follows:

$(\%N)=-0.07 \cdot (\%X)+0.6\%$.  [10]

Line (9) shows the combinations of indium and nitrogen contents in the well layer which provided for 950 nm intrinsic emission (950 nm PL peak) at 300°K while using the minimum amount of aluminum in the barrier layer. Line (8) can be mathematically defined as $N=-0.07 \cdot X+0.0075$  [11]

for atomic ratios of indium between 0 and 0.10, where the parameter N represents the atomic ratio of nitrogen and the parameter X represents the atomic ratio of indium. Equation [11] may be written in terms of percent content as follows:

$(\%N)=-0.07 \cdot (\%X)+0.75\%$.  [12]

Line (10) shows the combinations of indium and nitrogen contents in the well layer which provided for 995 nm intrinsic emission (995 nm PL peak) at 300°K while using 10% aluminum in the barrier layer (same percentage of aluminum as used for line (2)). Line (10) can be mathematically defined as $N=-0.07 \cdot X+0.0135$  [13]

for atomic ratios of indium between 0 and 0.10, where the parameter N represents the atomic ratio of nitrogen and the parameter X represents the atomic ratio of indium. Equation [13] may be written in terms of percent content as follows:

$(\%N)=-0.07 \cdot (\%X)+1.35\%$.  [14]

For constructing lasers to operate in the 980 nm wavelength band (~965 nm–~995 nm) while taking into account temperature shifts and the use of de-tuning, the combinations of indium and nitrogen in the well layer are preferably set at or above the line defined by equations [5] and [6] (i.e., line (7)), and at or below the line defined by equations [7] and [8]. A preferred lower boundary of the combinations may be set at or above the line defined by equations [9] and [10] (i.e., line (8)), or at or above the line defined by equations [11] and [12] (i.e., line (9)). A preferred upper boundary of the combinations may be set at or below the line defined by equations [13] and [14] (i.e., line (10)), or at or below the line defined by equations [3] and [4] (i.e., line (2)).

As previously indicated, as the indium content in the well layer(s) decreases towards 0%, the inventors have further found that the lower limit of aluminum content in the barrier layers rises. For the important emission wavelength of 950 nm the lower limit of aluminum content in the barrier layer rises from 1% (at 5% indium) towards approximately 5.5% (at 0% indium content), in a roughly inverse linear manner. In other words, the lower limit of aluminum in the barrier layers increases from 1% to 3.25% and then to 5.5% as the indium content in the well layer(s) decreases from 5% to 2.5% and then to 0%, respectively.

(2) In the Case of GaInAsP Barrier Layers

Figure 5A:
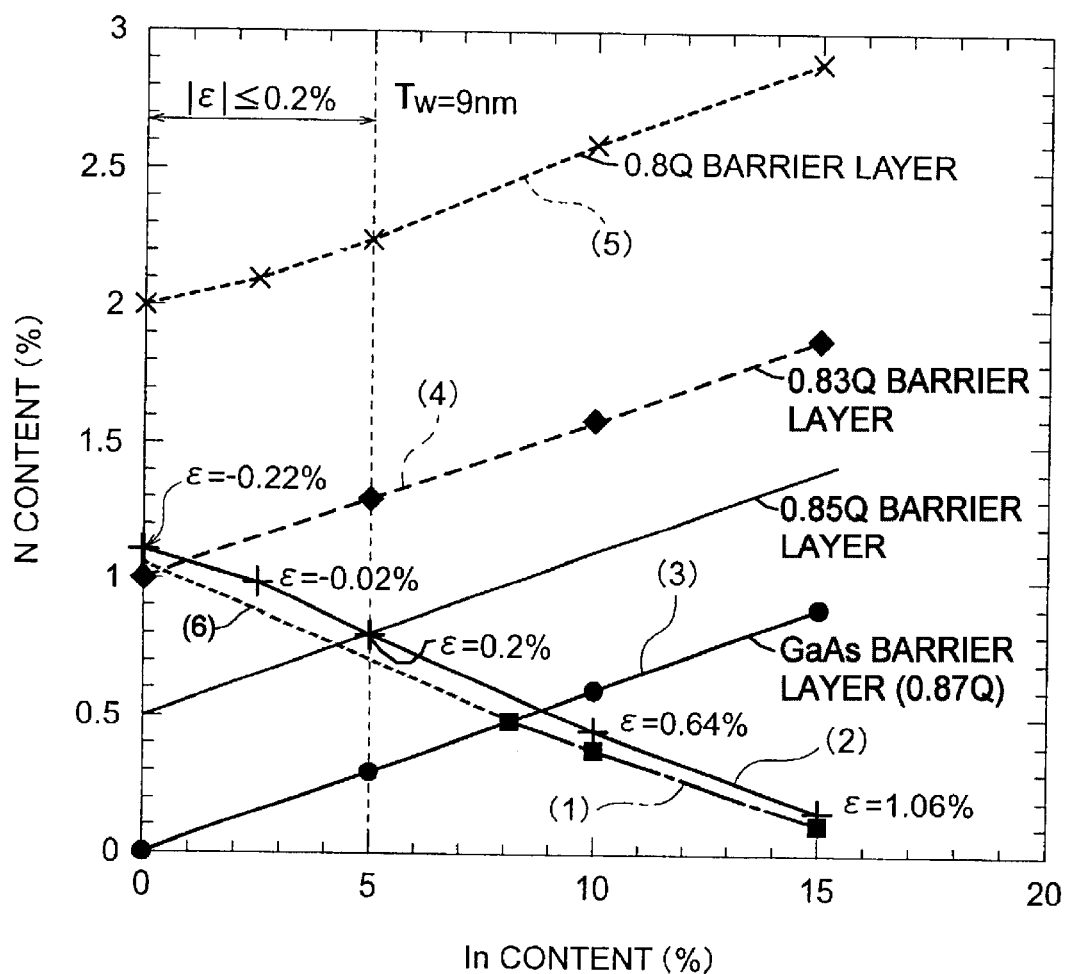
FIG. 5A is a compositional diagram of an active layer with the composition of a barrier layer being a parameter, in the GaInNAs/GaInAsP MQW active layer structure in the embodiment shown in FIG. 2 according to the present invention.

Exemplary combinations of indium (In) content and nitrogen (N) content for achieving a GaInNAs well layer having an emission wavelength of 980 nm, with the barrier layer comprising GaInAsP material, are shown by lines (1) and (2) in FIG. 5A. Each of lines (1) and (2) in FIG. 5A shows a combination of both the contents which provides an emission wavelength of 980 nm in the case wherein the thickness of each well layer is set at 9 nm, with the composition of the GaInAsP barrier layer being a parameter. For line (1), both the indium content and the phosphorous content are zero (i.e., GaAs, a 0.87 Q barrier layer). For line (2), the barrier composition is $Ga_{0.844}In_{0.156}As_{0.686}P_{0.314}$, which has a corresponding bandgap wavelength of 0.80 μm, and barrier layer is referred to as a 0.80Q barrier layer. Similar lines for GaInAsP barrier layers with lower bandgap wavelengths appear above line (2), and are relatively close to line (2). The $Ga_xIn_{1-x}As_yP_{1-y}$ material generally lattice-matches to the GaAs substrate, having a strain magnitude which is less than or equal to 0.2%, for a modest range of x and y values, which can be readily obtained in practice. In order for lattice-matching the well layer to the GaAs substrate, with the strain as $\epsilon \leq 0.2\%$, the indium (In) content in the well layer should be 5% or below from FIG. 5A.

FIG. 5A also shows three lines (3), (4), and (5), which are drawn for the three cases where the barrier layers of the quantum-well structure have band gap wavelengths of 0.87 μm, 0.83 μm, and 0.80 μm, respectively, and which are substantially lattice matched to the GaAs substrate. The barrier layer with bandgap wavelength of 0.87 μm is provided by GaAs material. The barrier layer with bandgap wavelength of 0.83 μm is identified as the 0.83Q Barrier Layer in the figure and may be provided by the composition of $Ga_{0.908}In_{0.092}As_{0.815}P_{0.185}$. The barrier layer with bandgap wavelength of 0.80 μm is identified as the 0.8Q Barrier Layer in the figure and may be provided by the composition of $Ga_{0.844}In_{0.156}As_{0.686}P_{0.314}$. Line (3) in FIG. 5A shows the dividing line between type-I (FIG. 6A) and type-II (FIG. 6B) band structures of the quantum well in the case where the barrier layers comprise GaAs material and where the well layer(s) comprise various combinations of indium and nitrogen contents; it is the same as line (3) in FIG. 4A. Each of lines (4) and (5) in FIG. 5A is similar to line (3) in meaning except that line (4) is drawn for barrier layers comprised of GaInAsP compositions which have bandgap wavelengths of 0.83 μm and which are substantially lattice matched to GaAs, and material and line (5) is drawn for barrier layers comprised of GaInAsP compositions which have bandgap wavelengths of 0.80 μm and which are substantially lattice matched to GaAs. Combinations of indium and nitrogen which line above lines (4) and (5) produce type-II quantum-well structures for the respective barrier-layer compositions represented by these lines; and compositions at or below the lines (4) and (5) produce type-I quantum-well structures. Additional lines similar to lines (3)–(5) may be drawn for other barrier-layer compositions with bandgap wavelengths below 0.80 μm; these additional lines will be substantially parallel to lines (3)–(5). In addition to lines (3)–(5), an approximate line for lattice matched GaInAsP compositions with a bandgap wavelength of 0.85 μm is shown in FIG. 5A ("0.85Q Barrier Layer"). An exemplary composition for the 0.85Q barrier layer is $Ga_{0.951}In_{0.049}As_{0.901}P_{0.099}$.

In FIG. 5A, it can be seen from the intersections of lines (1), (2) and (3) that the strain can be reduced to only a limited level of $\epsilon=0.47\%$ in the type-I structure for the case of a GaAs barrier layer (0.87Q Barrier Layer). Further reduction in the magnitude of the strain can be achieved by decreasing the bandgap wavelength of the barrier layer(s) in order to maintain the type-I quantum well structure. Line (6) shows the combinations of indium and nitrogen contents (as percentages of their respective atomic groups) in the well layer which maintain 980 nm laser emission while using an InGaAsP composition having the highest possible bandgap wavelength in the barrier layer which maintains type-I band structure. For laser emission at 980 nm, the combinations of indium and nitrogen in the well layer is preferably set at or slightly above line (6), and usually at or below line (2). Line (6) of FIG. 5A is substantially identical to line (6) of FIG. 4A, and can be mathematically described by the above equations [1] and [2]. Line (2) of FIG. 5A can be mathematically approximated by equations [3] and [4] above.

It can be seen from the intersections of lines (2), (4), (6), and the 0.85Q Barrier Layer Line that the bandgap wavelength of the barrier layer should reside on a shorter side of wavelengths of 0.85 μm to 0.82 μm, in order for limiting the strain as 0.2%, with the QW structure assuming a type-I structure.

More specifically, a GaInNAs well layer having an In content of 5% requires a substantially lattice-matching GaInAsP barrier layer having a bandgap wavelength equal to or shorter than 0.85 μm, whereas a GaNAs well layer (i.e., a GaInNAs well layer having a zero indium content) requires a substantially lattice-matching GaInAsP barrier layer having an emission wavelength shorter than approximately 0.83 μm (more specifically, equal to or shorter than 0.828 μm).

Figure 5B:
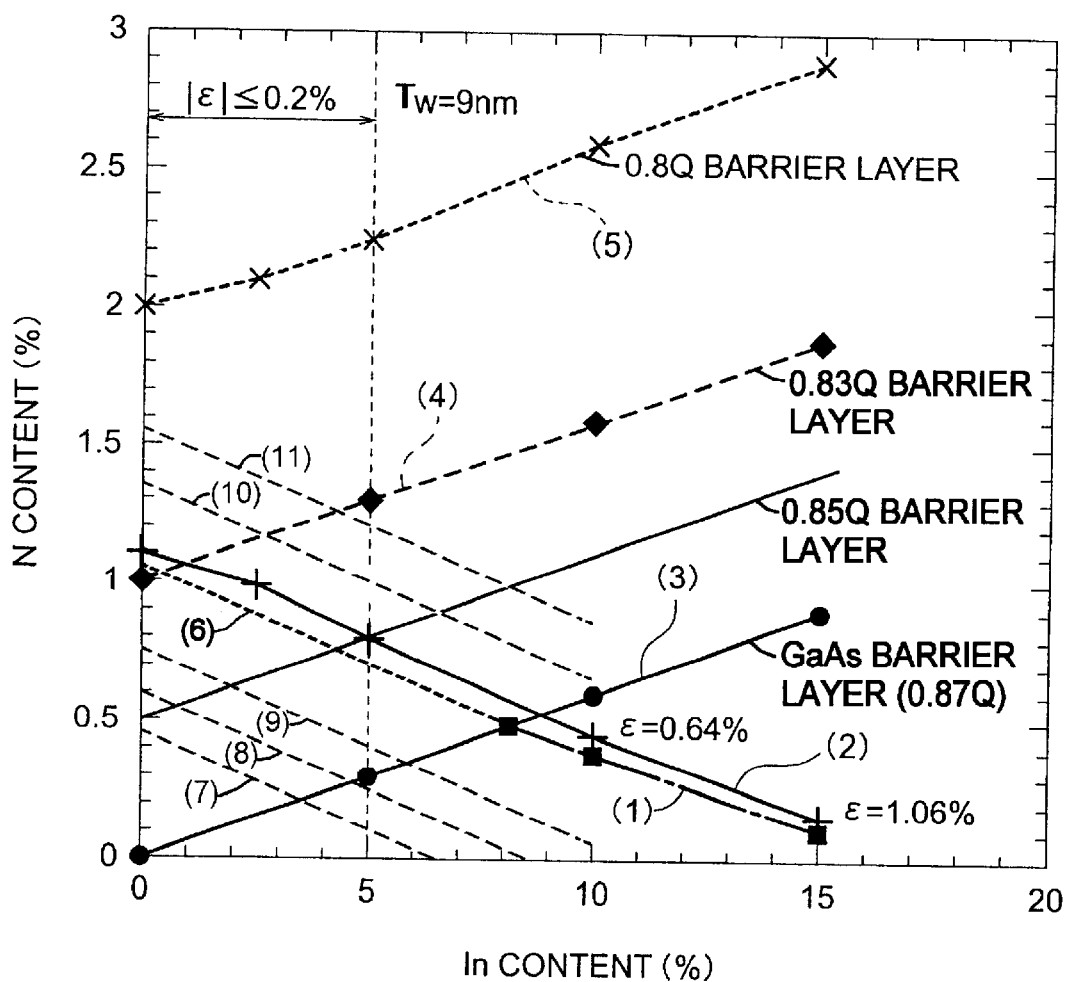
FIG. 5B is the compositional diagram of FIG. 5A with preferred ranges of indium and nitrogen contents indicated thereof according to the present invention.

The lines (7)–(11) for emission at 920 nm, 935 nm, 950 nm, 995 nm and 1010 nm shown in FIG. 4B are applicable to the GaInAsP barrier layer embodiments, and are duplicated in FIG. 5B. The above-described selections of these lines (and their corresponding equations) for the upper and lower composition bounds in the (Al)GaAs barrier layer embodiments (FIG. 4B) are applicable to the GaInAsP barrier layer embodiments.

Although the bandgap of the $Al_{0.05}Ga_{0.95}As$ barrier layer shown in FIGS. 4A and 4B is substantially the same as the bandgap of the 0.83Q barrier layer, a larger nitrogen content is allowed in the GaInAsP barrier layer to assume a type-I structure compared to the $Al_{0.05}Ga_{0.95}As$ barrier layer. The reason therefor is as follows.

Figure 7:
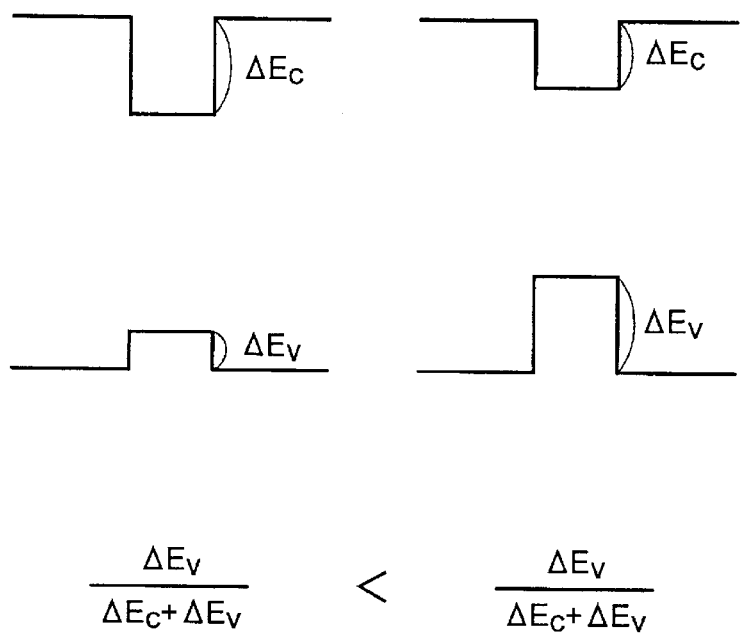
FIG. 7 shows bandgap diagrams of MQW structures shown in FIGS. 2 and 3 for comparison of valence band offset ratio therebetween.

Referring to FIG. 7, there are shown bandgap diagrams of a GaInNAs/AlGaAs QW structure and a GaInNAs/GaInAsP QW structure. Each of the QW structures has an offset energy $\Delta Ev$ in the valance band and an offset energy $\Delta Ec$ in the conduction band. The sum of the two offset energies ($\Delta Ec+\Delta Ev$) is the same for the two QW structures when the same well composition is used for each, and when the barrier layers have the same bandgap wavelength. However, the value of $\Delta Ev$ is greater for the GaInNAs/GaInAsP QW structure than it is for the GaInNAs/AlGaAs QW structure. Thus, the GaInNAs/GaInAsP QW structure has a valence band offset ratio, defined by formula $\Delta Ev/(\Delta Ec+\Delta Ev)$, which is larger than the valence band offset ratio of the GaInNAs/AlGaAs QW structure because the GaInNAs/GaInAsP QW structure has a larger valence band offset energy $\Delta Ev$, as shown in FIG. 7.

Figure 8:
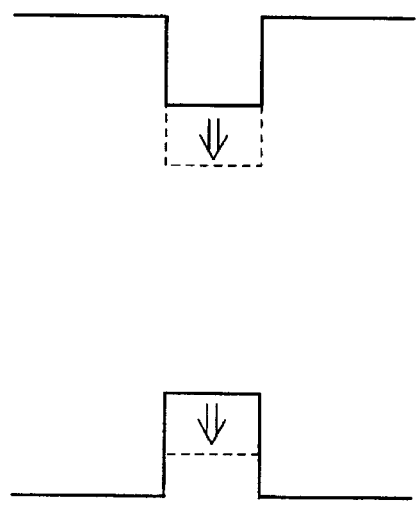
FIG. 8 is an explanatory bandgap diagram of a MQW structure having a higher indium (In) content.

If the nitrogen content in the GaInNAs well layer is increased, as shown in FIG. 8, the bandgap energy is shifted toward a lower energy level as shown by dotted lines therein, whereby the valence band offset ratio is lowered. Thus, it is understood that GaInNAs/GaInAsP QW structure can have a higher nitrogen content without turning to the type-II structure compared to the GaInNAs/AlGaAs QW structure in view of the fact that it has a larger valence band offset energy $\Delta Ev$.

As described above, by selecting a specific combination of the composition of the GaInNAs well layer and the composition of the AlGaAs or GaInAsP barrier layer, a type-I QW structure can be obtained having a substantially zero strain, whereby a 980-nm-band strain-free GaInNAs laser diode having lower threshold, higher optical efficiency and higher reliability can be achieved.

EXPERIMENTAL RESULTS

First Example Embodiment

Now, the present invention is more specifically described with reference to the preferred exemplary embodiments.

Figure 2:
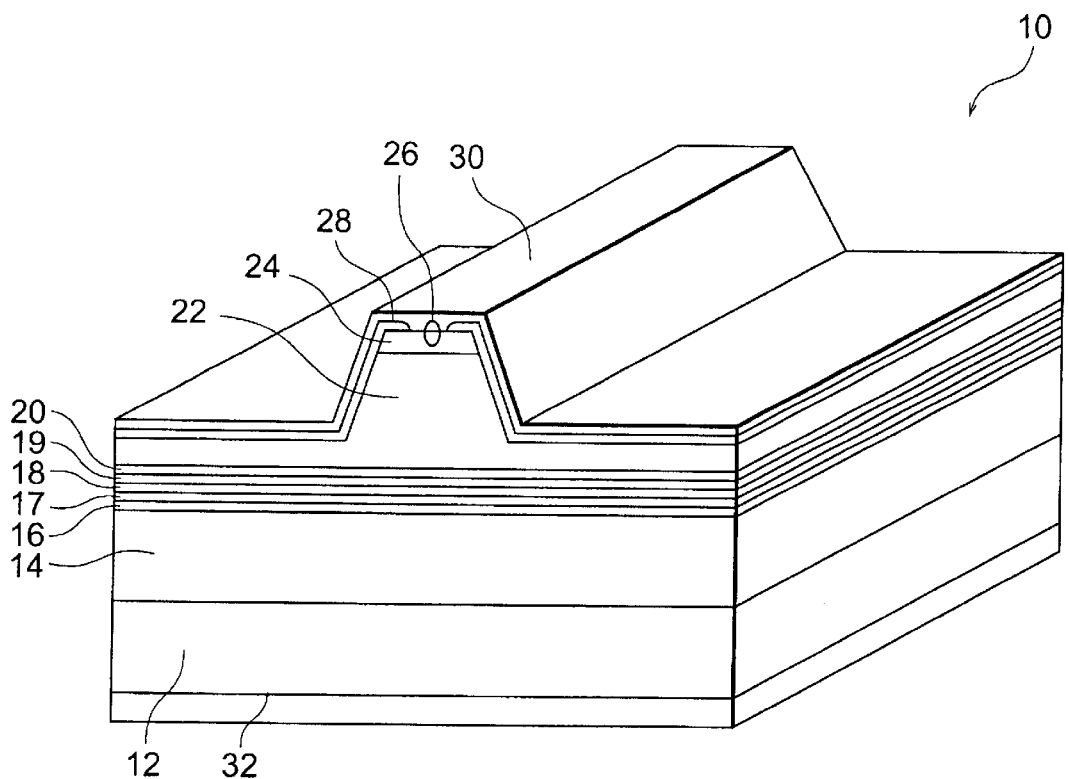
FIG. 2 is a perspective view of a laser device according to a first embodiment of the present invention.

Referring to FIG. 2, a laser diode, generally designated by numeral 10, according to a first example embodiment of the present invention is of a ridge-stripe waveguide type and is similar to the laser diode of FIG. 1 except for the structure of the laser active layer.

More specifically, the laser diode 10 includes a GaAs substrate 12, and a resonant cavity formed on the GaAs substrate 12. The resonant cavity has a layer structure including an n-$Al_{0.3}Ga_{0.7}As$ lower cladding layer 14, an undoped $Al_{0.2}Ga_{0.8}As$ lower separate confinement heterostructure (SCH) layer 16, an undoped $Al_{0.1}Ga_{0.9}As$ bottom barrier layer 17, an InGaAsN MQW active layer structure 18, an undoped $Al_{0.1}Ga_{0.9}As$ top barrier layer 19, an undoped $Al_{0.2}Ga_{0.8}As$ upper SCH layer 20, a p-$Al_{0.3}Ga_{0.7}As$ upper cladding layer 22, and a p-GaAs cap layer 24 consecutively formed on the n-GaAs substrate 12.

Among the layer structure, the cap layer 24 and the top portion of the cladding layer 22 are configured to form a mesa stripe having a ridge waveguide. On the side surfaces of the mesa structure and the top of the cladding layer 22, a SiN film 28 is formed except for an opening 26 which exposes therefrom the top surface of the cap layer 24. A p-side electrode 30 made of metallic films including Ti/Pt/Au films is formed on the SiN film 28 and in contact with the cap layer 24 through the opening 26. An n-side electrode 32 made of metallic films including AuGeNi/Au films on the bottom surface of the GaAs substrate 12.

For an efficient emission of the optical output, the laser diode has an emission end coated with a dielectric coat having a low reflectance of 5%, and a rear end coated with a dielectric multilayer film having a high reflectance of 92%, although not specifically illustrated in the figure.

A sample (first sample) of the laser diode 10 of the first embodiment was fabricated, which included $Ga_xIn_{1-x}As_yN_{1-y}$ well layer wherein the indium content (1-x) is 0.1 and the nitrogen content (1-y) is 0.005.

The first sample included an active layer structure having a photoluminescence (PL) wavelength of 975 nm, and a lattice mismatch of 0.65% in terms of the compressive strain.

The first sample was driven for a hundred hours at a constant driving current of 700 mA in an automatic current control test, followed by observation of the active layer by a transmission electron microscope to examine whether or not the phase separation occurred in the GaInAsN well layer. No phase separation was observed. The In content and the nitrogen content employed in the first sample is shown at A11 on line (2) in FIG. 9 which is extracted from FIG. 4A.

Another sample (second sample) of the first embodiment wherein the indium content (1-x) is-0.07 and the nitrogen content (1-y) is 0.007 in the $Ga_xIn_{1-x}As_yN_{1-y}$ well layer, and another sample (third sample) of the first embodiment wherein the indium content (1-x) is 0.04 and the nitrogen content (1-y) is 0.009 in the $Ga_xIn_{1-x}As_yN_{1-y}$ well layer were fabricated for evaluation of the laser characteristics.

The second and third samples included a MQW active layer structure having a PL wavelength of 975 nm similarly to the first sample, and lattice mismatches of 0.35% and 0.1%, respectively, in terms of the compressive strain.

The second and third samples were driven for a hundred hours under conditions similar to those in the first sample, followed by observation of the active layer by a transmission electron microscope to reveal no phase separation therein. The combinations of indium (In) content and nitrogen (N) content in the second and third samples are shown at A12 and A13, respectively, on line (2) in FIG. 9.

For comparison with the first through the third sample, a conventional laser diode 60 of FIG. 1 having an InGaAs/GaAs based active layer structure and having an emission wavelength of 980 nm was fabricated as a comparative example. The comparative example was subjected to the similar test and revealed a phase separation in a length of 1 μm in the vicinity of the emission end (optical output facet).

It was confirmed from the above experiments that the laser diode of the present embodiment has a higher reliability in a long-term operation at a high output power.

Second Example Embodiment

Figure 3:
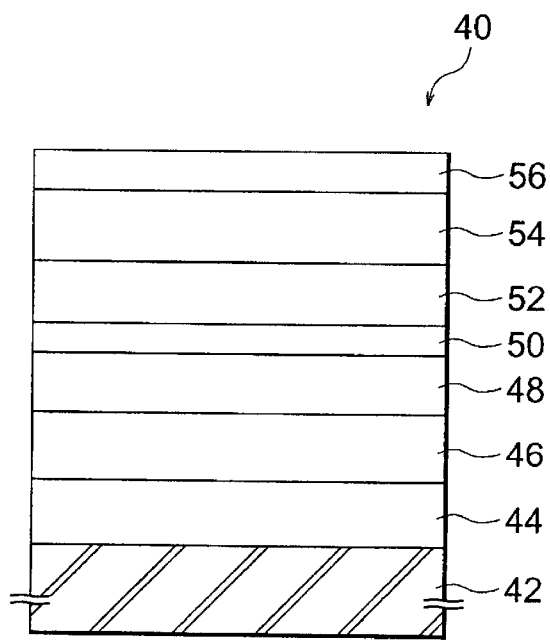
FIG. 3 is a sectional view of a layer structure of a laser device according to a second embodiment of the present invention.

Referring to FIG. 3, a laser diode, generally designated by numeral 40, according to a second example embodiment of the present invention includes an n-GaAs substrate 42 having a thickness of 100 μm, and a resonant cavity formed on the (100) lattice plane of the n-GaAs substrate 42. The resonant cavity has a layer structure including a 0.5-μm-thick n-GaAs buffer layer 44 having an impurity concentration of concentration of $1\times10^{18} cm^{-3}$, a 0.05-μm-thick $Al_{0.1}Ga_{0.9}As$ bottom barrier layer 48, a $Ga_xIn_{1-x}As_yN_{1-y}$ QW active layer 50, a 0.05- μm-thick $Al_{0.1}Ga_{0.9}As$ top barrier layer 52, a 2- μm-thick p-$Al_{0.3}Ga_{0.7}As$ upper cladding layer 54 having an impurity concentration of $1\times10^{18} cm^{-3}$, and a 0.3- μm-thick p-GaAs contact layer 56 having an impurity concentration of $1\times10^{19} cm^{-3}$ consecutively formed on the n-GaAs substrate 42.

The QW structure of the laser diode of the present embodiment is implemented by a GaInNAs/AlGaAs SQW structure having a $Ga_{0.975}In_{0.025}N_{0.0}As_{0.99}$ well layer 50. The well layer 50 has a tensile strain of 0.02% and a thickness of 9 nm. The $Al_{0.1}Ga_{0.9}As$ barrier layer has a bandgap wavelength of 0.8 μm.

Although not specifically illustrated in the figure, the top portion of the lower cladding layer 46, the bottom barrier layer 48, the QW active layer 50, the top barrier layer 52, the upper cladding layer 54 and the p-GaAs contact layer 56 are configured to form a ridge stripe having an active layer width of 3 μm.

A p-side electrode (not shown) has a multilayer structure including Ti/Pt/Au p-type ohmic metallic films formed on top of the contact layer 56. An n-side electrode (not shown) has a multilayer structure including Au-Ge/Ni/Au metallic films formed on the bottom surface of the n-GaAs substrate 42.

The resonant cavity has a cavity length of 1200 μm, and has an emission end (output facet) coated with a low reflection coat having a reflectance of 5% and a rear end coated with a high reflection coat having a reflectance of 95%.

The layer structure is grown on the GaAs substrate 42 by an epitaxial process such as gas source MBE technique, MBE technique, CBE technique, or MOCVD technique. The grown layers are then configured to form a ride-stripe waveguide structure by using photolithographic and etching steps.

A sample of the second embodiment was fabricated and subjected to measurements of the optical output-injection current characteristics as well as a life test. The optical output-injection current characteristics thus measured are such that the threshold current at a temperature of 25 degrees C. was as low as 25 mA and the saturated optical output was 600 mW, which were satisfactory and equivalent to the conventional GaInAs based laser diode. The estimated lifetime measured at an optical output power was one million hours which were far greater than the about ten thousand hours of the conventional GaInAs based laser diode.

The location of the indium (In) content and the nitrogen (N) content of the second embodiment is shown at point A2 on line (2) of FIG. 9.

The atomic ratios of the elements in the well layer of this embodiment may be varied within the following preferred set of ranges:

0.015 to 0.035 for indium (In),
0.965 to 0.985 for gallium (Ga),
0.006 to 0.014 for nitrogen (N), and
0.986 to 0.994 for arsenic (As);

and varied within the following further preferred set of ranges:

0.02 to 0.03 for indium (In),
0.97 to 0.98 for gallium (Ga),
0.008 to 0.012 for nitrogen (N), and
0.988 to 0.992 for arsenic (As).

The atomic ratio of aluminum in the barrier layer is preferably within a range of 0.06 to 0.14, and more preferably within a range of 0.08 to 0.12. However, values above 0.12 may be used.

The second embodiment is exemplified for the ideal case wherein the QW active layer has a substantially zero strain. However, a variety of combinations of indium content and nitrogen content in the well layer and a variety of AlGaAs barrier layers having different Al contents can be used so long as the strain ε of the well layer satisfies $|\epsilon|<0.2$.

For example, the laser diode may have a configuration wherein a GaInNAs active layer having an indium content of 5% may be combined with an AlGaAs barrier layer having an Al content of 3% or more, whereas a GaNAs active layer having zero indium content may be combined with an AlGaAs barrier layer having an Al content of 7% or more.

Third Example Embodiment

A laser diode according to a third example embodiment of the present invention is similar to the second embodiment shown in FIG. 3 except that the third embodiment includes a $Ga_{x2}In_{1-x2}As_{y2}P_{1-y}$ barrier layer, which is lattice-matched to the GaAs substrate and has a bandgap wavelength of 0.80 μm, instead of the AlGaAs barrier layer in the second embodiment.

In the third embodiment, the $GaInNAs/Ga_{x2}In_{1-x2}As_{y2}P_{1-y2}$ QW structure has a $Ga_{0.975}In_{0.025}N_{0.01}As_{0.99}$ single well layer having a tensile strain of 0.02%. Each of the top and bottom $Ga_{x2}In_{1-x2}As_{y2}P_{1-y2}$ barrier layers 48 and 52 has a Ga content x2 of 0.844 and an As content y2 of 0.686, and is a 0.8Q barrier layer (i.e., $Ga_{0.844}In_{0.156}As_{0.686}P_{0.314}$). The atomic ratios of the gallium, indium, arsenic and nitrogen elements can be varied within the preferred ranges indicted above in the Second Example Embodiment. In addition, the bandgap wavelength of the barrier layer may be varied from 0.78 μm to 0.85 μm.

The third embodiment is shown at point B3 on line (2) of FIG. 10, which is extracted from FIG. 5A.

By using the barrier layers as described above, the strain of the well layer can be maintained at 0.2% or lower, whereby the laser diode can operate for a long term at a higher output power. The Ga content x2 and the As content y2 in the above formula may satisfy $0<x2<1$ and $0<y2<1$.

In addition, an optical confinement layer may be interposed between each barrier layer and a corresponding cladding layer. The optical confinement layer, if used, may be a SCH AlGaAs layer or a graded index(GRIN)-SCH $Al_xGa_{1-x}As$ layer.

Fourth Example Embodiment

A laser diode according to a fourth example embodiment of the present invention is similar to the second example embodiment shown in FIG. 3 except for the configurations of the well layer and the barrier layers.

More specifically, the fourth embodiment includes barrier layers each made of $Ga_{x2}In_{1-x2}As_{y2}P_{1-y2}$ wherein x2=0.844 and y2=0.686 (bandgap wavelength of 0.80 μm), and a $GaIn_{0.05}AsN_{0.008}Sb_{0.016}$ well layer. The barrier layer may be called 0.8Q barrier layer. As indicated in the Summary of Invention section, the small amount of antimony (Sb) improves the crystallinity of the well layer. The well layer is shown at point B4 on line (2) of FIG. 10.

The fourth embodiment may include a $GaIn_{0.05}AsN_{0.008}Sb_{0.016}$ well layer and $Al_{0.1}Ga_{0.9}As$ barrier layers instead. This combination is shown at point A4 on line (2) of FIG. 9. The laser diode of the fourth embodiment had characteristics similar to those of the second embodiment.

The atomic ratios of the elements in the well layer of this embodiment may be varied within the following preferred set of ranges:

0.03 to 0.07 for indium (In),
0.93 to 0.97 for gallium (Ga),
0.005 to 0.011 for nitrogen (N),
0.0095 to 0.022 for antimony (Sb), and
0.96 to 0.99 for arsenic (As);

and varied within the following further preferred set of ranges:

0.04 to 0.06 for indium (In),
0.94 to 0.96 for gallium (Ga),
0.0065 to 0.0095 for nitrogen (N),
0.013 to 0.019 for antimony (Sb), and
0.970 to 0.981 for arsenic (As).

For AlGaAs barrier layers, the atomic ratio of aluminum in the barrier layer is preferably within a range of 0.06 to 0.14, and more preferably within a range of 0.08 to 0. 12. However, values above 0.12 may be used. For GaInAsP barrier layers, the bandgap wavelength of the barrier layer may be varied from 0.78 μm to 0.86 μm.

General Remarks

In the embodiments presented above, the well layer has a width of 9 nm. However, the width is not limited to the specific example. In the present invention, since the strain of the well layer is 0.2% or less with respect to the GaAs substrate, the width of the well layer may have a larger width so long as the quantum effect is maintained. For maintaining the quantum effect, the width of the active layer is preferably about 15 nm or less.

In the above examples, the laser diodes have a ridge-stripe waveguide. However, the present invention may be applied to any type of the waveguide such as of buried heterostructure (BH) stripe or Transverse-Junction Structure (TJS).

The laser diode of the present invention operates at a higher optical output power and can be used as a light source of an optical device in an optical communication, a pumping light source of a solid state laser, a light source for a wavelength conversion device such as SHG (second harmonic generation). The laser diode is also suited to a 980-nm-band pumping laser diode for EDFA or Raman amplifier applications.

The above embodiments are directed to laser diodes having an emission wavelength of 980 nm; however, the present invention can be applied to a 1480-nm-band pumping laser diode.

Since the above embodiments are described only for examples, the present invention is not limited to the above embodiments and various modifications or alterations can be easily made therefrom by those skilled in the art without departing from the scope of the present invention.

What is claimed is:

1. A semiconductor laser diode comprising:

a GaAs substrate having a top surface; and a resonant cavity having a layer structure formed on said GaAs substrate and being oriented to guide light in a direction parallel to the top surface of the GaAs substrate, said layer structure having an active layer which generates light when an electric current is passed through it, said active layer having a light-generation layer which comprises a first amount of group-III atoms and a second amount of group-V atoms, said first amount of group-III atoms including at least gallium (Ga) and said second amount of group-V atoms including at least arsenic (As), said light-generation layer further including at least one of the elements of indium and nitrogen, the indium being limited to an atomic ratio in the range of 0.0 to 0.10 with respect to the amount of group-III atoms, the nitrogen being limited to an atomic ratio in the range of 0.0 to 0.025 with respect to the amount of group-V atoms, wherein said light-generating layer has at least one cladding layer in a position that is located on a top side of the light-generating layer and at least one cladding layer in a position that is located on a bottom side of the light-generating layer.

2. The semiconductor laser diode as defined in claim 1, wherein said light-generation layer has an atomic ratio in the range of 0.0 to 0.10 with respect to the amount of group-III atoms, and wherein the atomic ratio of nitrogen (N) in the light-generation layer with respect to the amount of group-V atoms in the light-generation layer is in the range of 0.0045 to 0.025.

3. The semiconductor laser diode as defined in claim 1, wherein said light-generation layer includes nitrogen (N) at an atomic ratio in a range from 0.0 to 0.012 with respect to the amount of group-V atoms.

4. The semiconductor laser diode as defined in claim 1, wherein said light-generation layer includes both of the elements of indium and nitrogen, and wherein the atomic ratio of indium (In) with respect to the amount of group-III atoms in said light-generation layer and the atomic ratio of nitrogen (N) with respect to the amount of group-V atoms in said light-generation layer satisfy the relationship:

$$N \geq -0.07 \cdot X + 0.0045$$

where the parameter N represents the atomic ratio of nitrogen in the light-generation layer and the parameter X represents the atomic ratio of indium in the light-generation layer, wherein the light-generation layer generates light when an electric current is passed through it.

5. The semiconductor laser diode as defined in claim 4, wherein the atomic ratio of indium (In) with respect to the amount of group-III atoms in said light-generation layer and the atomic ratio of nitrogen (N) with respect to the amount of group-V atoms in said light-generation layer further satisfy the relationship:

$$N \leq -0.07 \cdot X + 0.0155$$

where the parameter N represents the atomic ratio of nitrogen and the parameter X represents the atomic ratio of indium.

6. The semiconductor laser diode as defined in claim 4, wherein the atomic ratio of indium (In) with respect to the amount of group-III atoms in said light-generation layer and the atomic ratio of nitrogen (N) with respect to the amount of group-V atoms in said light-generation layer further satisfy the relationship:

$$N \leq -0.07 \cdot X + 0.0135$$

where the parameter N represents the atomic ratio of nitrogen and the parameter X represents the atomic ratio of indium.

7. The semiconductor laser diode as defined in claim 4, wherein the atomic ratio of indium (In) with respect to the amount of group-III atoms in said light-generation layer and the atomic ratio of nitrogen (N) with respect to the amount of group-V atoms in said light-generation layer further satisfy the relationship:

$$N \leq -0.07 \cdot X + 0.0115$$

where the parameter N represents the atomic ratio of nitrogen and the parameter X represents the atomic ratio of indium.

8. The semiconductor laser diode as defined in claim 1, wherein said light-generation layer includes both of the elements of indium and nitrogen, and wherein the atomic ratio of indium (In) with respect to the amount of group-III atoms in said light-generation layer and the atomic ratio of nitrogen (N) with respect to the amount of group-V atoms in said light-generation layer satisfy the relationship:

$$N \geq -0.07 \cdot X + 0.006$$

where the parameter N represents the atomic ratio of nitrogen in the light-generation layer and the parameter X represents the atomic ratio of indium in the light-generation layer, wherein the light-generation layer generates light when an electric current is passed through it.

9. The semiconductor laser diode as defined in claim 8, wherein the atomic ratio of indium (In) with respect to the amount of group-III atoms in said light-generation layer and the atomic ratio of nitrogen (N) with respect to the amount of group-V atoms in said light-generation layer further satisfy the relationship:

$$N \leq -0.07 \cdot X + 0.0155$$

where the parameter N represents the atomic ratio of nitrogen and the parameter X represents the atomic ratio of indium.

10. The semiconductor laser diode as defined in claim 8, wherein the atomic ratio of indium (In) with respect to the amount of group-III atoms in said light-generation layer and the atomic ratio of nitrogen (N) with respect to the amount of group-V atoms in said light-generation layer further satisfy the relationship:

$$N \leq -0.07 \cdot X + 0.0135$$

where the parameter N represents the atomic ratio of nitrogen and the parameter X represents the atomic ratio of indium.

11. The semiconductor laser diode as defined in claim 8, wherein the atomic ratio of indium (In) with respect to the amount of group-III atoms in said light-generation layer and the atomic ratio of nitrogen (N) with respect to the amount of group-V atoms in said light-generation layer further satisfy the relationship:

$$N \leq -0.07 \cdot X + 0.0115$$

where the parameter N represents the atomic ratio of nitrogen and the parameter X represents the atomic ratio of indium.

12. The semiconductor laser diode as defined in claim 1, wherein said light-generation layer includes both of the elements of indium and nitrogen, and wherein the atomic ratio of indium (In) with respect to the amount of group-III atoms in said light-generation layer and the atomic ratio of nitrogen (N) with respect to the amount of group-V atoms in said light-generation layer satisfy the relationship:

$$N \geq -0.07 \cdot X + 0.0075$$

where the parameter N represents the atomic ratio of nitrogen in the light-generation layer and the parameter X represents the atomic ratio of indium in the light-generation layer, wherein the light-generation layer generates light when an electric current is passed through it.

13. The semiconductor laser diode as defined in claim 12, wherein the atomic ratio of indium (In) with respect to the amount of group-III atoms in said light-generation layer and the atomic ratio of nitrogen (N) with respect to the amount of group-V atoms in said light-generation layer further satisfy the relationship:

$N \leq -0.07 \cdot X + 0.0155$ where the parameter N represents the atomic ratio of nitrogen and the parameter X represents the atomic ratio of indium.

14. The semiconductor laser diode as defined in claim 12, wherein the atomic ratio of indium (In) with respect to the amount of group-III atoms in said light-generation layer and the atomic ratio of nitrogen (N) with respect to the amount of group-V atoms in said light-generation layer further satisfy the relationship:

$N \leq -0.07 \cdot X + 0.0135$ where the parameter N represents the atomic ratio of nitrogen and the parameter X represents the atomic ratio of indium.

15. The semiconductor laser diode as defined in claim 12, wherein the atomic ratio of indium (In) with respect to the amount of group-III atoms in said light-generation layer and the atomic ratio of nitrogen (N) with respect to the amount of group-V atoms in said light-generation layer further satisfy the relationship:

$N \leq -0.07 \cdot X + 0.0115$ where the parameter N represents the atomic ratio of nitrogen and the parameter X represents the atomic ratio of indium.

16. The semiconductor laser diode as defined in claim 1, wherein the atomic ratio of Indium (In) in the light-generation layer with respect to the amount of group-III atoms in the light-generation layer is limited to the range of 0.0 to 0.05.

17. The semiconductor laser diode as defined in claim 16, wherein the atomic ratio of nitrogen (N) in the light-generation layer with respect to the amount of group-V atoms in the light-generation layer is in the range of 0.001 to 0.025.

18. The semiconductor laser diode as defined in claim 1 wherein said light-generation layer comprises indium (In) at an atomic ratio in the range of 0.0 1 5 to 0.035 with respect to the amount of group-III atoms, gallium (Ga) at an atomic ratio in the range of 0.965 to 0.985 with respect to the amount of group-III atoms, nitrogen (N) at an atomic ratio in the range of 0.006 to 0.014 with respect to the amount of group-V atoms, and arsenic (As) at an atomic ratio in the range of 0.986 to 0.994 with respect to the amount of group-V atoms.

19. The semiconductor laser diode as defined in claim 18 wherein said active layer further comprises a barrier layer disposed adjacent to said light-generation layer, and wherein said barrier layer comprises $Al_zGa_{1-z}As$ with the atomic ratio "z" of aluminum being equal to or greater than 0.06 and less than or equal to 0.14.

20. The semiconductor laser diode as defined in claim 18 wherein said active layer further comprises a barrier layer disposed adjacent to said light-generation layer, and wherein said barrier layer comprises GaInAsP having a bandgap wavelength in the range from 0.78 Am to 0.85 µm.

21. The semiconductor laser diode as defined in claim 1 wherein said light-generation layer comprises indium (In) at an atomic ratio in the range of 0.02 to 0.03 with respect to the amount of group-III atoms, gallium (Ga) at an atomic ratio in the range of 0.97 to 0.98 with respect to the amount of group-III atoms, nitrogen (N) at an atomic ratio in the range of 0.008 to 0.012 with respect to the amount of group-V atoms, and arsenic (As) at an atomic ratio in the range of 0.988 to 0.992 with respect to the amount of group-V atoms.

22. The semiconductor laser diode as defined in claim 21 wherein said active layer further comprises a barrier layer disposed adjacent to said light-generation layer, and wherein said barrier layer comprises $Al_zGa_{1-z}As$ with the atomic ratio "z" of aluminum being equal to or greater than 0.08 and less than or equal to 0.12.

23. The semiconductor laser diode as defined in claim 21 wherein said active layer further comprises a barrier layer disposed adjacent to said light-generation layer, and wherein said barrier layer comprises GaInAsP having a bandgap wavelength in the range from 0.78 µm to 0.85 µm.

24. The semiconductor laser diode as defined in claim 1 wherein said light-generation layer comprises indium (In) at an atomic ratio in the range of 0.03 to 0.07 with respect to the amount of group-III atoms, gallium (Ga) at an atomic ratio in the range of 0.93 to 0.97 with respect to the amount of group-III atoms, nitrogen (N) at an atomic ratio in the range of 0.005 to 0.011 with respect to the amount of group-V atoms, antimony (Sb) at an atomic ratio in the range of 0.0095 to 0.022 with respect to the amount of group-V atoms, and arsenic (As) at an atomic ratio in the range of 0.96 to 0.99 with respect to the amount of group-V atoms.

25. The semiconductor laser diode as defined in claim 24 wherein said active layer further comprises a barrier layer disposed adjacent to said light-generation layer, and wherein said barrier layer comprises $AlzGa_{1-z}As$ with the atomic ratio "z" of aluminum being equal to or greater than 0.06 and less than or equal to 0.14.

26. The semiconductor laser diode as defined in claim 24 wherein said active layer further comprises a barrier layer disposed adjacent to said light-generation layer, and wherein said barrier layer comprises GaInAsP having a bandgap wavelength in the range from 0.78 µm to 0.86 µm.

27. The semiconductor laser diode as defined in claim 1 wherein said light-generation layer comprises indium (In) at an atomic ratio in the range of 0.04 to 0.06 with respect to the amount of group-III atoms, gallium (Ga) at an atomic ratio in the range of 0.94 to 0.96 with respect to the amount of group-III atoms, nitrogen (N) at an atomic ratio in the range of 0.0065 to 0.0095 with respect to the amount of group-V atoms, antimony (Sb) at an atomic ratio in the range of 0.013 to 0.019 with respect to the amount of group-V atoms, and arsenic (As) at an atomic ratio in the range of 0.97 to 0.981 with respect to the amount of group-V atoms.

28. The semiconductor laser diode as defined in claim 27 wherein said active layer further comprises a barrier layer disposed adjacent to said light-generation layer, and wherein said barrier layer comprises $Al_zGa_{1-z}As$ with the atomic ratio "z" of aluminum being equal to or greater than 0.08 and less than or equal to 0.12.

29. The semiconductor laser diode as defined in claim 27 wherein said active layer further comprises a barrier layer disposed adjacent to said light-generation layer, and wherein said barrier layer comprises GaInAsP having a bandgap wavelength in the range from 0.78 µm to 0.86 µm.

30. The semiconductor laser diode as defined in claim 1 wherein the second amount of group-V atoms in said light-generation layer includes antimony (Sb) at an atomic ration of 0.04 or less with respect to the amount of group-V atoms.

31. The semiconductor laser diode as defined in claim 1 wherein the second amount of group-V atoms in said light-generation layer includes antimony (Sb) at an atomic ration of 0.091 or less with respect to the amount of group-V atoms.

32. The semiconductor laser diode as defined in claim 1, wherein said light-generation layer includes both indium and nitrogen, and has a lattice strain with respect to the GaAs substrate which is less than or equal to 0.2% in magnitude.

33. The semiconductor laser diode as defined in claim 1, wherein said active layer includes both indium and nitrogen, and has a lattice strain with respect to the GaAs substrate which is less than or equal to 0.65% in magnitude.

34. The semiconductor laser diode as defined in claim 1, wherein said light-generation layer has a peak in its photoluminescence spectrum in the wavelength range of 920 nm to 1010 nm.

35. The semiconductor laser-diode as defined in claim 1, wherein said laser emits light in the wavelength of 920 nm to 1010 nm when a current is past through the active layer.

36. The semiconductor laser diode as defined in claim 1 wherein said active layer further comprises a barrier layer disposed adjacent to said light-generation layer, and wherein said barrier layer comprises $Al_zGa_{1-z}As$ with the atomic ratio "z" of aluminum being equal to or greater than 0.03 and less than or equal to 1.0.

37. The semiconductor laser diode as defined in claim 1, wherein the cavity resonator has a first facet and a second facet, and wherein the laser emits at least 100 mW of optical power from the first facet.

38. The semiconductor laser diode as defined in claim 37, wherein the at least 100 mW of optical power is emitted through a surface portion at the first facet, the surface portion having an area which is less than 100 square micron.

39. The semiconductor laser diode as defined in claim 1, wherein the atomic ratio of gallium (Ga) with respect to the amount of group-III atoms in said light-generation layer is equal to or greater than 0.5, and wherein the atomic ratio of arsenic (As) with respect to the amount of group-V atoms in said light-generation layer is equal to or greater than 0.5.

40. The semiconductor laser diode as defined in claim 1, wherein the light-generation layer has a thickness of 15 nm or less.

* * * * *